United States Patent [19]

McGuire et al.

[11] Patent Number: 4,638,261

[45] Date of Patent: Jan. 20, 1987

[54] LOW NOISE AMPLIFIER WITH HIGH INTERCEPT POINT

[75] Inventors: Charles F. McGuire, Kaysville; Gordon C. Steyaert, Salt Lake City, both of Utah; John M. Fontaine, Scottsdale, Ariz.

[73] Assignee: Sperry Corporation, Blue Bell, Pa.

[21] Appl. No.: 769,377

[22] Filed: Aug. 26, 1985

[51] Int. Cl.[4] .............................................. H03F 3/60
[52] U.S. Cl. .................................. 330/277; 330/286; 330/295
[58] Field of Search .................. 330/53, 277, 286, 295

[56] References Cited

PUBLICATIONS

Aihara et al., "11 and 14 GHz-Band Low-Noise GaAs FET Amplifiers", NEC Res. & Dev. (Japan) No. 44, Jan. 1977, pp. 16-22.
Arai et al., "High Power GaAs FET Amplifier for TWT Replacement", Fujitsu Scientific & Technical Journal, Sep. 1979, pp. 63-82.
Honjo et al., "15-Watt Internally Matched GaAs FETs and 20-Watt Amplifier Operating at 6 GHz", NEC Res. & Dev. (Japan), Jan. 1980, pp. 157-162.
Niclas et al., "Application of the Two-Way Balanced Amplifier Concept to Wide-Band Power Amplification Using GaAs MESFETs", IEEE Transactions on Microwave Theory and Techniques, V. MTT-28, No. 3, Mar. 1980, pp. 172-179.
Mitama et al., "Low Noise 7 GHz-and UHF-Band GaAs MESFET Amplifiers for TV Broadcasting Equipment", NEC Res. & Develop, (Japan), Jul. 1978, pp. 69-78.
Pengelly, "Broadband Lumped-Element X Band GaAs FET Amplifier", Electronics Letters, vol. 11, No. 3, Feb. 6, 1975, pp. 58, 59.
Slaymaker et al., "GaAs MESFET Small-Signal X--Band Amplifiers", IEEE Transactions on Microwave Theory and Technique, vol. MTT-24, No. 6, pp. 329-337, Jun. 1976.
Sone et al., "14-GHz Band 1 Watt GaAs FET Amplifier", Electronics Letters, vol. 15, No. 7, Mar. 29, 1979, pp. 212, 213.

Primary Examiner—James B. Mullins
Attorney, Agent, or Firm—Glenn W. Bowen

[57] ABSTRACT

A low noise amplifier (LNA) circuit including a linear amplifier which generates low noise in the presence of a high level signal and includes a field effect transistor with input and output matching networks and which retains linear operation in the presence of high level (high magnitude) interfering signals.

6 Claims, 5 Drawing Figures

LOW NOISE AMPLIFIER WITH HIGH INTERCEPT POINT

BACKGROUND

1. Field of the Invention

This invention relates to amplifier circuits, in general, and to linear, low noise amplifier circuits in particular, especially those with high third order intercept points.

2. Prior Art

There are many amplifier circuits known in the art. For the most part, amplifier circuits are developed to provide a maximum output signal in response to an input signal. In some cases, the output signal maximum is related to the power generated by the amplifier. In other cases, the signal maximum is related to the amplitude of the voltage or the current at the output of the amplifier.

In many applications, it is desirable to reduce the noise generated by the system through the expedient of appropriate matching. This frequently results in an optimum noise operation but with a sacrifice in gain of the amplifier circuit.

On the other hand, if the amplifier is used in conjunction with a system which is arranged to observe or detect a small signal in an environment of large signals, the small signal can often be lost. That is, if the amplifier is used to limit or filter the larger signal, the smaller signal is also limited and is frequently lost.

To avoid this loss, some systems have been devised using compressive receiver techniques or the like. This technique permits a small signal to be picked out of signal pattern including larger signals. However, this procedure and apparatus tends to be quite complex and costly.

Another approach is to use an isolator, a low noise amplifier and another isolator (arranged in series) to perform this function. However, the isolators frequently have a tendency to be rather lossy wherein this technique is less than perfect.

Thus, a relatively simple, inexpensive technique for separating low level signals from a large scale signal background is highly desirable.

CROSS REFERENCES

Reference is made to copending application Ser. No. 769,376, entitled 10 WATT X-BAND POWER AMPLIFIER by the same inventors as herein, filed on Aug. 26, 1985, and assigned to the common assignee.

SUMMARY OF THE INVENTION

This invention is directed to a linear amplifier which generates low noise in the presence of a high level signal. The circuit provides large signal amplification with an extremely high third order intercept point. In particular, a field effect transistor (FET) is associated with matching networks at the input and output of the FET. The input matching network is, typically, of conventional low noise design while the output matching network is designed to maximize the power output of the FET. Thus, the FET can be a relatively large device which is not usually considered to be a low noise amplifier device.

DESCRIPTION OF A PREFERRED EMBODIMENT

Figure 1:
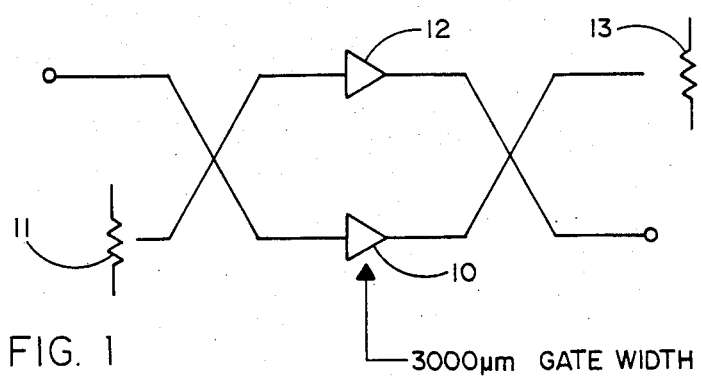
FIG. 1 is a schematic representation of a system using the amplifier of the instant invention.

Referring now to FIG. 1, there is shown an amplifier circuit represented by a triangular element 10. In addition, a load or attenuation component 11 is shown schematically. A suitable amplifier circuit is described in detail in the copending application noted supra. In a preferred embodiment, the attenuator component is rated at 50 ohms.

The output of gain block 12 is crossed over the output of gain block 10 and, perhaps supplied to another gain block (not shown). The output of gain block circuit 10 is supplied to attenuating resistor 13, and, perhaps, to another gain block (not shown). Each of the gain blocks, as represented by the triangular element in FIG. 1, is a single ended amplifier circuit or device. Moreover, the gain block devices are connected together through a dispersive medium such as micro-strip line, open-strip or other dispersive medium.

By utilizing the load or attenuating devices 11 and 13, (as well as others), the maximum voltage and current values of the FET are permitted. This operation, therefore, produces the maximum power from the respective circuits.

Figure 2:
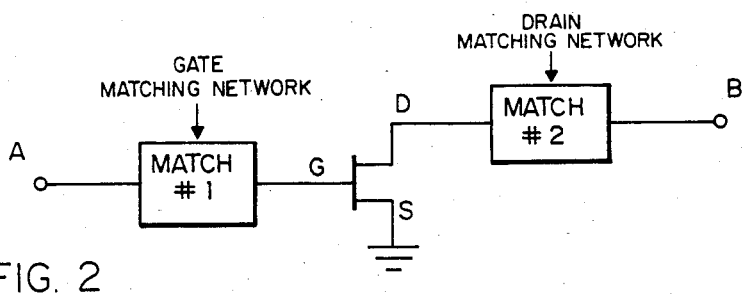
FIG. 2 is a schematic representation of the circuit of the instant invention.

Referring now to FIG. 2, there is shown a schematic representation of one amplifier circuit constructed in accordance with the instant invention and which can be used effectively with the system described in the copending application. The unit amplifier in the output stage is a balanced stage of two single ended amplifiers. These amplifiers use very large FETs, e.g. on the order of 3000 micron gate width. By maintaining the output load that was developd, it is possible to generate the maximum power of the FET. However, a conjugate match is not used as was the case in the past. Rather, in this circuit, the input network is selected for an optimum noise match. In other words, a noise match is not a complex conjugate match. Thus, the circuit appears to sacrifice a small amount of gain for the optimum noise performance of the data.

The expected result, in fabricating the circuit of the instant invention, would have been the production of an amplifier with a very poor noise figure. Typically, it would be predicted that noise generated in the FET would be proportional to the width of the FET gate. However, with this circuit configuration, the FET operates so that the noise is not proportional to the size of the FET. Rather, the noise is proportional to the resistive and capacitive FET components. However, the resistance decreases with increasing FET size while capacitance increases. Thus, when using a very large FET, a very large amount of noise is not produced. A moderate amount of noise may be produced in this circuit but it is by no means in proportion with the increase in gate periphery. From noise match measurements it is noted that the circuit is a reasonably good noise figure amplifier. For example, the circuit has a noise figure on the order of 3-5 dB with an associated gain of about 5-7 dB, depending on the particular stage that is observed.

Figure 3:
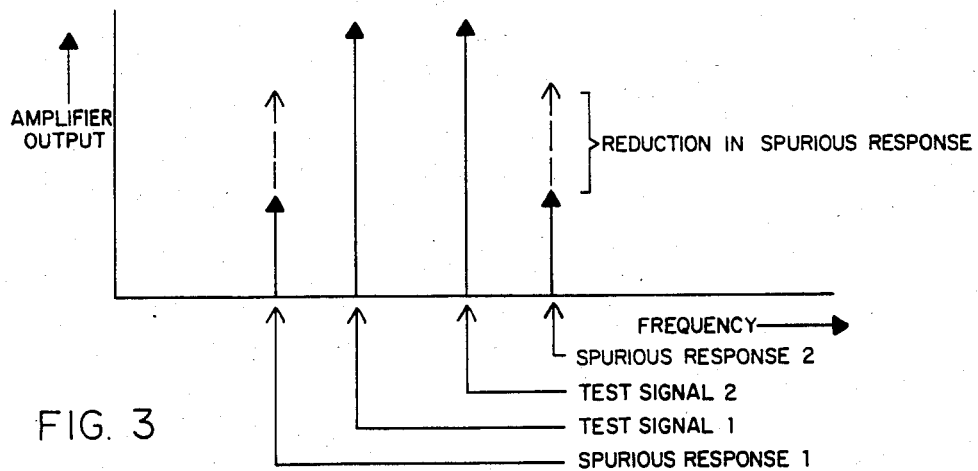
FIG. 3 is a graphic representation of the operation of the circuit of the instant invention.

However, the property that makes the amplifier very useful is the high intercept point referenced in FIG. 3. That is, in characterizing the circuit the power output is roughly proportional to the third order intercept point. This is a measure of how well two unrelated signals can be processed through the amplifier and not be distorted. For example, in an electronic environment where small signals are to be observed and a large signal is generated in the same range it is desirable to be able to filter out the large signal and still have the small signal available for operation. Insertion of a limiting amplifier in the circuit will limit the large signal and distort the small signal as well, whereupon the small signal is, effectively, lost. However, in this circuit, a large gate width power FET is used wherein the input circuit is optimized for minimum noise (not $S_{11}*$) and the output circuit is optimized for maximum power (not $S_{22}*$). Thus, the resultant amplifier has a low noise figure and a very high intercept point commensurate with the large gate width FET utilizing this power loading concept. More particularly, this amplifier exhibited a 10–15 dB higher inteept point than previously obtainable.

As shown in FIG. 1, the circuit uses quadrature couplers of the Lange type to balance a pair of amplifiers to produce good input and output reflection coefficients. Thus, the amplifiers are cascadable without the requirement for use of isolators which have a tendency to be more lossy.

The amplifier structure shown in FIG. 2 includes a gate matching network and a drain matching network. The gate network consists, typically, of bond wires connecting a distributed dispersive media, in this case micro stripline, to the gate electrode of the FET. The printed transmission line network is constructed of micro stripline impedance transformers with open and short circuit stubs. This network presents a standard noise match to the gate of the FET. Thus, the minimum noise factor is achieved. The drain network uses construction of the same type as in the gate network but designed to present the optimal power load as described in the copending application noted above and bearing Ser. No. 769,376. With the optimal power load presented to the FET a high intercept point is achieved. Thus, by the combination of a low noise input network, a high power output network together with a large gate width FET, the high intercept point, low noise amplifier is achieved.

In summary, the circuit uses a standard low noise matching network on the input, a large FET device, (one not usually sold as a low noise amplifier), and a unique output network to obtain the unexpected noise figure characteristics.

FIG. 3 is a graphic representation of the signals produced by the circuit of the instant invention. A comparison of spurious repsonse of the low noise amplifier is shown in FIG. 3. In particular, test signals 1 and 2 are injected at the input of the amplifier. Distortion in the amplifier causes spurious responses, such as spurious responses 1 and 2, which should be minimized in order to achieve good circuit operation. The particular circuit of the instant invention causes a further reduction of these unwanted signals.

Figure 4A:
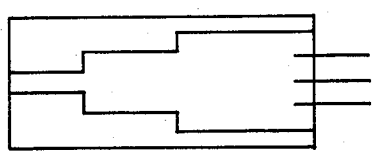
FIGS. 4A and 4B are schematic representations of input matching networks for use with the circuit of the instant invention.
Figure 4B:
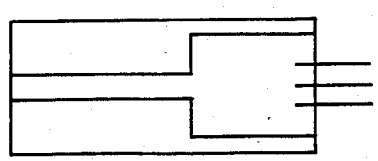

FIGS. 4A and 4B show representative designs for the input matching networks which are optimized for noise minimization in the circuit. These matching networks are formed of strip-line techniques and are joined to the FET by bond wires or the like. Of course, other matching network configurations can be used as desired. For example, equivalent networks can be formed using Transverse Electric and Magnetic or TEM (i.e. nondispersive) media, in lower frequency devices, or lumped element circuits. Unique in this invention is the use of the combination of the "low noise" input with the "high power" output in conjunction with a large FET. The particular implementation may be formed of any or a combination of all lumped, dispersive or nondispersive circuit elements.

Thus, there is shown and described one embodiment of the instant invention. Those skilled in the art may conceive of modifications or changes which can be made to this embodiment. However, any such modifications or changes which fall within the purview of this description are intended to be included therein as well. This description is intended to be illustrative only and is not intended to be limitative. Rather, the scope of the invention is limited only by the claims appended hereto.

We claim:

1. A low noise, high intercept point, single ended, linear amplifier comprising,
   a field effect transistor including a gate electrode, a source electrode and a drain electrode,
   said transistor having large gate width parameters on the order of 3000 microns,
   a gate matching network comprising a distributed dispersive media connected to the gate electrode of said transistor to present a standard noise match to said gate electrode thereby to achieve a minimum noise factor for said amplifier, and
   a drain matching network comprising a distributed dispersive media connected to the drain electrode of said transistor in order to provide the optimal power load for said transistor thereby to achieve a high intercept point.

2. The amplifier recited in claim 1 including,
   bond wires connecting said media to the gate electrode of said FET.

3. The amplifier recited in claim 1 wherein,
   said gate matching network comprises micro stripline.

4. The amplifier recited in claim 1 wherein,
   said gate matching network comprises open strip.

5. An amplifying system which exhibits low noise, high intercept points and maximum power, comprising
   at least one low noise, high intercept point, single ended, and linear amplifier circuit including,
   a field effect transistor including a gate electrode, a source electrode and a drain electrode,
   said transistor having large gate width parameters on the order of 3000 microns,
   a gate matching network comprising a distributed dispersive media connected to the gate electrode of said transistor to present a standard noise match to said gate electrode thereby to achieve a minimum noise factor for said amplifier,
   a drain matching network comprising a distributed dispersive media connected to the drain electrode of said transistor so as to thereby
   provide the optimal power load for said transistor thereby to achieve high intercept point operation,
   input load means connected to an input of said amplifier circuit at said gate matching network, and
   output load means connected to an output of said amplifier circuit at said drain matching network.

6. The system recited in claim 5 including,
   a pair of said amplifier circuits connected by means of Lange-type quadrature couplers in order to balance said pair of amplifier circuits and to produce good input and output reflection coefficients.

* * * * *